(12) United States Patent
Liou

(10) Patent No.: US 6,391,716 B1
(45) Date of Patent: May 21, 2002

(54) METHOD FOR FORMING POLY SPACER ELECTRON TUNNEL OXIDE FLASH WITH ELECTRIC-FIELD ENHANCING CORNERS FOR POLY TO POLY ERASE

(75) Inventor: Liann-Chern Liou, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/633,469

(22) Filed: Aug. 7, 2000

(51) Int. Cl.$^7$ .............................................. H01L 21/336

(52) U.S. Cl. ....................... 438/257; 438/250; 438/393; 257/317

(58) Field of Search .................................. 438/257, 211, 438/277, 283, 182, 195; 257/316, 317

(56) References Cited

U.S. PATENT DOCUMENTS 6,093,945 A * 7/2000 Yang ........................... 257/317

* cited by examiner

*Primary Examiner*—David Nelms
*Assistant Examiner*—Dung Anh Le
(74) *Attorney, Agent, or Firm*—Powell, Goldstein, Frazer & Murphy LLP

(57) ABSTRACT

The present invention provides a method for forming a poly spacer ETOX (Electron Tunnel Oxide) flash memory device with a floating gate having electric-field enhancing corners for poly to poly erase. Here, a polysilicon spacer is used as an erase gate. A floating gate having four acute angles from top view is formed, it can raise the electric field between the floating and the erase gate. The present invention can not only raise the efficiency of the erasing mechanism but also reduce the stress produced by transferred electrodes through the tunnel oxide layer in program/erase cycles and lessen the cell size with poly to poly erase.

19 Claims, 12 Drawing Sheets

METHOD FOR FORMING POLY SPACER ELECTRON TUNNEL OXIDE FLASH WITH ELECTRIC-FIELD ENHANCING CORNERS FOR POLY TO POLY ERASE

BACKGROUND OF THE INVENTION

1. Field of the Invention

The present invention generally relates to a non-volatile memory, and more particularly to an Electron Tunnel Oxide (ETOX) flash memory device with electric-field corners for poly to poly erase.

2. Description of the Prior Art

In conventional ETOX flash memory device, programming and erasing mechanisms are using the same tunnel oxide layer which electrons are transferred through the same tunnel oxide layer and the tunnel oxide layer has been stressed twice in one program/erase cycle. Therefore, the flash memory device will provide less program/erase cycles and a short lifetime. Conventional poly to poly erase flash memory device can solve aforesaid problem by providing another path to avoid transferred electrons through the same tunnel oxide layer twice in one program/erase cycle. However, conventional poly to poly erase flash memory device needs more space to provide for the erase gate and the cell size becomes bigger.

Referring to FIG. 1A, the poly spacer ETOX (Electron Tunnel Oxide) flash memory device with poly to poly erase provides a polysilicon spacer 144 as an erase gate, it can prolong the lifetime of the memory device and provide a smaller cell size. A stacking gate electrode 143 comprises a program tunnel oxide layer 120, a floating gate 140, a first dielectric 122, and a control gate 142 on a substrate 100, and further a source/drain region 110 in the substrate 10. The polysilicon spacer 144 is separated from the stacking gate electrode 143 and the substrate 100 by an erase tunnel oxide layer 124. In the programming mechanism, electrons followed the direction 160 are transferred from the substrate 100 through the program tunnel oxide layer 120 to the floating gate 140 and stored in the floating gate 140. In the erasing mechanism, electrons followed the direction 162 as well as the direction 164 are transferred from the floating gate 140 through the erase tunnel oxide layer 124 to the erase gate electrode 144.

Referring to FIG. 2B, a region 170 is a contact window and a region 169 is an active region. A region 166 is the floating gate 140 and a region 168 is the control gate 142. In the erasing mechanism, electrons are transferred to the erase gate 144 at corners of the floating gate 140. Although, it prolong the lifetime of the memory device and provide a smaller cell size. However, it is also important to find a method to raise the efficiency of the program/erase cycle.

SUMMARY OF THE INVENTION

It is an object of the invention that the use of the floating gate having electric field enhancing corners can raise the efficiency of the erasing mechanism.

In accordance with the present invention, a method is provided for forming a poly spacer ETOX (Electron Tunnel Oxide) flash memory device with a floating gate having electric-field enhancing corners for poly to poly erase. First, a substrate has a stacking gate electrode thereon which is formed by following steps. Then, a first polysilicon layer is deposited on the gate oxide layer. Then, a portion of the first polysilicon layer is removed to form polysilicon holes, in which the borders are obliqued to the edges of active regions. Next, a first dielectric layer is deposited on the first polysilicon layer and a second polysilicon layer is deposited on the first dielectric layer. Following, it is proceeded photolithography and etching processes to form a stacking gate electrode which comprising a floating gate having electric-field enhancing corners and a control gate. These field enhancing corners are located at the boundaries of control gate and smaller than 90 degree due to the oblique borders of the first polysilicon holes. The electrical field will be enhanced by these corners, by which, the electron transition from floating gate to erase gate will be easier in erase mode. The stacking gate electrode sequentially comprises a gate oxide layer as program tunnel oxide layer, a first polysilicon layer as the floating gate, a first dielectric layer, and a second polysilicon layer as the control gate on the substrate. Then, a second dielectric layer and a third polysilicon layer are sequentially deposited conformally on the stacking gate electrode and the substrate. Next, a third polysilicon layer is formed a polysilicon spacer by blanket etching which is using the second dielectric layer as a stop layer. Further, the second dielectric layer is blanket etched by using the polysilicon spacer as a hard mask.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad rang of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, while the present invention is illustrated by a number of preferred embodiments directed to silicon semiconductor devices, it is not intended that illustrations be a limitation on the scope or applicability of the present invention. Further, while the illustrative examples use insulated gate control structures, it should be recognized that the insulated gate portions may be replaced with light activated or current activated structure(s). Thus, it is not intended that the structures illustrated. These devices are included to demonstrate the utility and application of the present invention to presently preferred embodiments.

Moreover, although the embodiments illustrated herein are show in two-dimensional views, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1A:
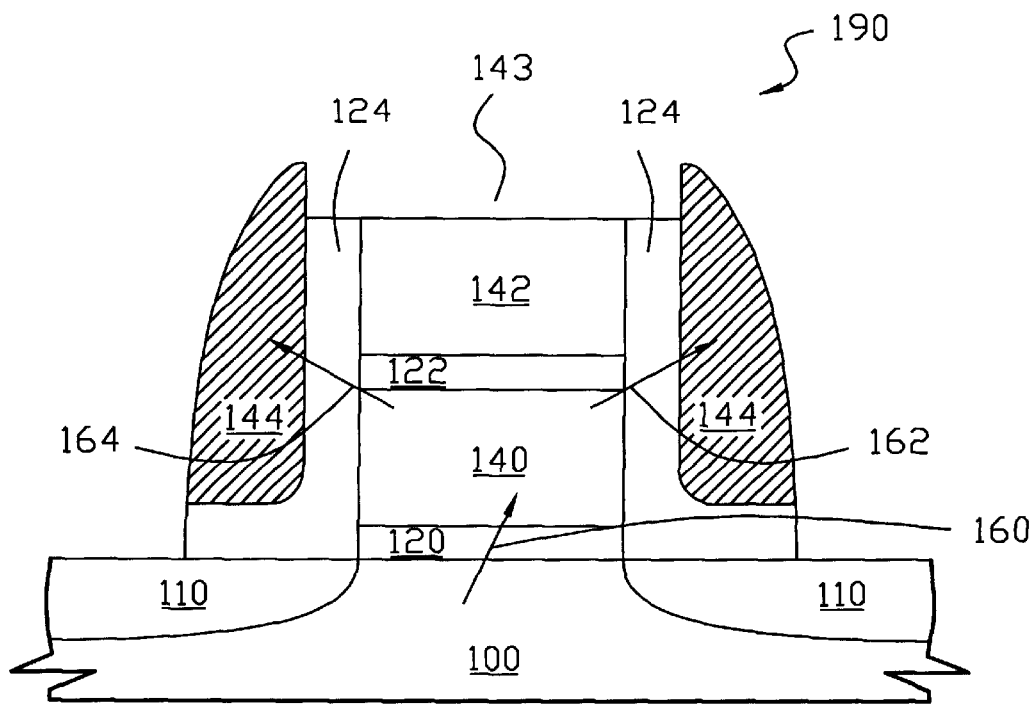
FIG. 1A to FIG. 1B are schematic representations of structures and the top views of poly spacer ETOX (Electron Tunnel Oxide) flash memory device with poly to poly erase, in accordance with the prior techniques.
Figure 1B:
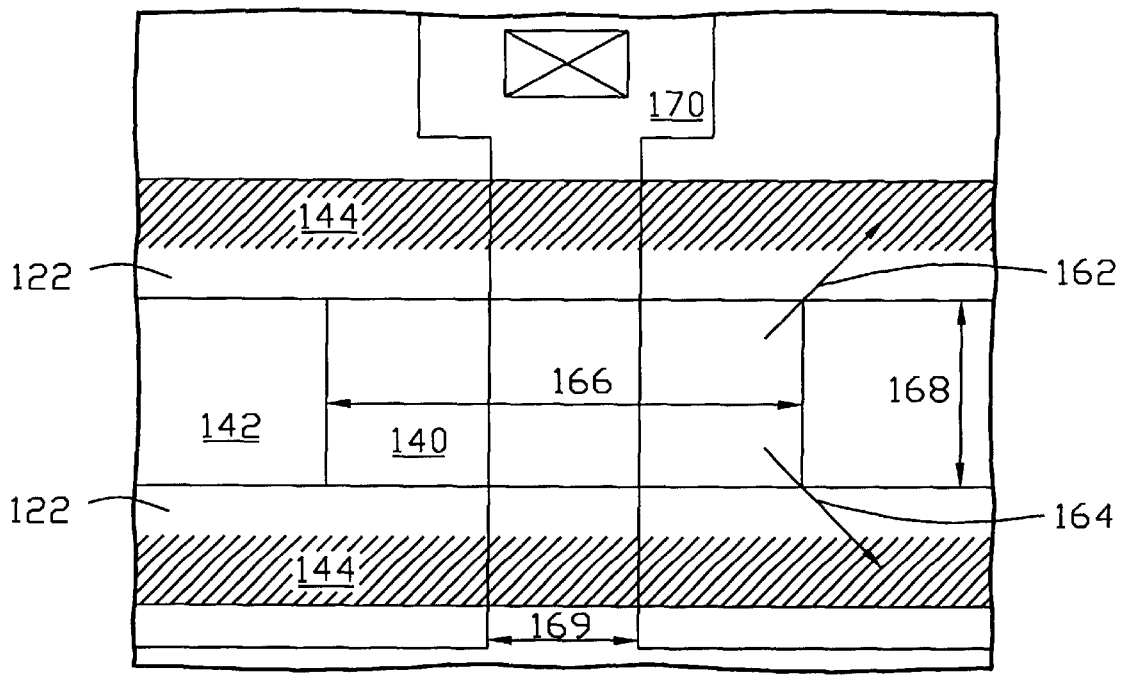
Figure 2A:
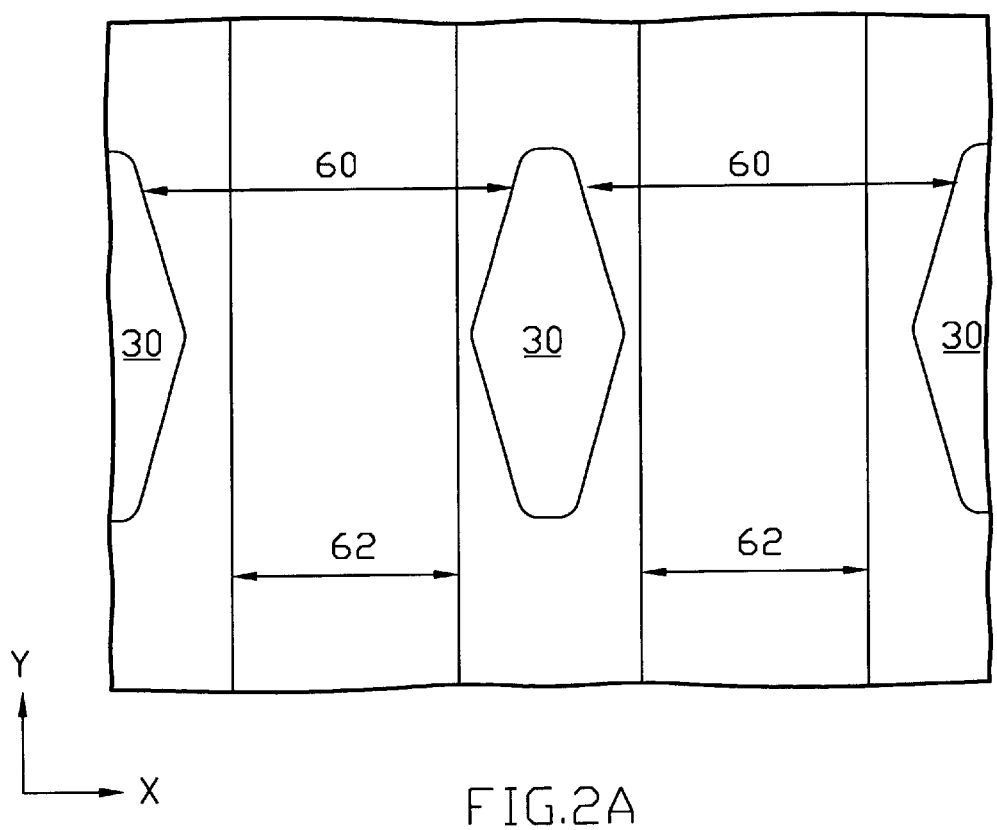
FIG. 2A to FIG. 2B are schematic representations of structures and the top views at various stages during the formulation of poly spacer ETOX flash memory device with field-enhancing corners for poly to poly erase, in accordance with the present invention.
Figure 2B:
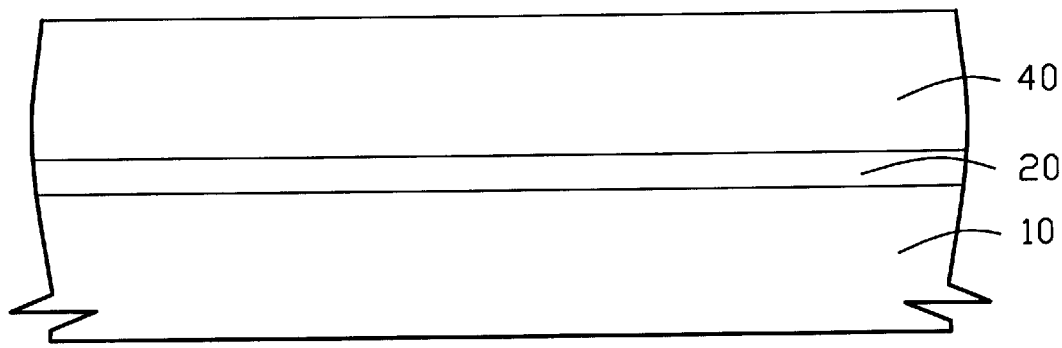

Referring to FIG. 2A and FIG. 2B, a gate oxide layer 20 used as a program tunnel oxide layer is formed on a substrate 10 shown in FIG. 2B. Next, it is proceeded a process to remove a portion of first polysilicon 40 to form polysilicon hole 30. According to FIG. 2A, the reference number 60 is a range of the polysilicon 40. No border of these polysilicon holes 30 is vertical and parallel to the border of an active region 62, and the shape of these polysilicon holes 40 from top view can comprises lozenges shaped, round shape, and elliptically shape.

Figure 3A:
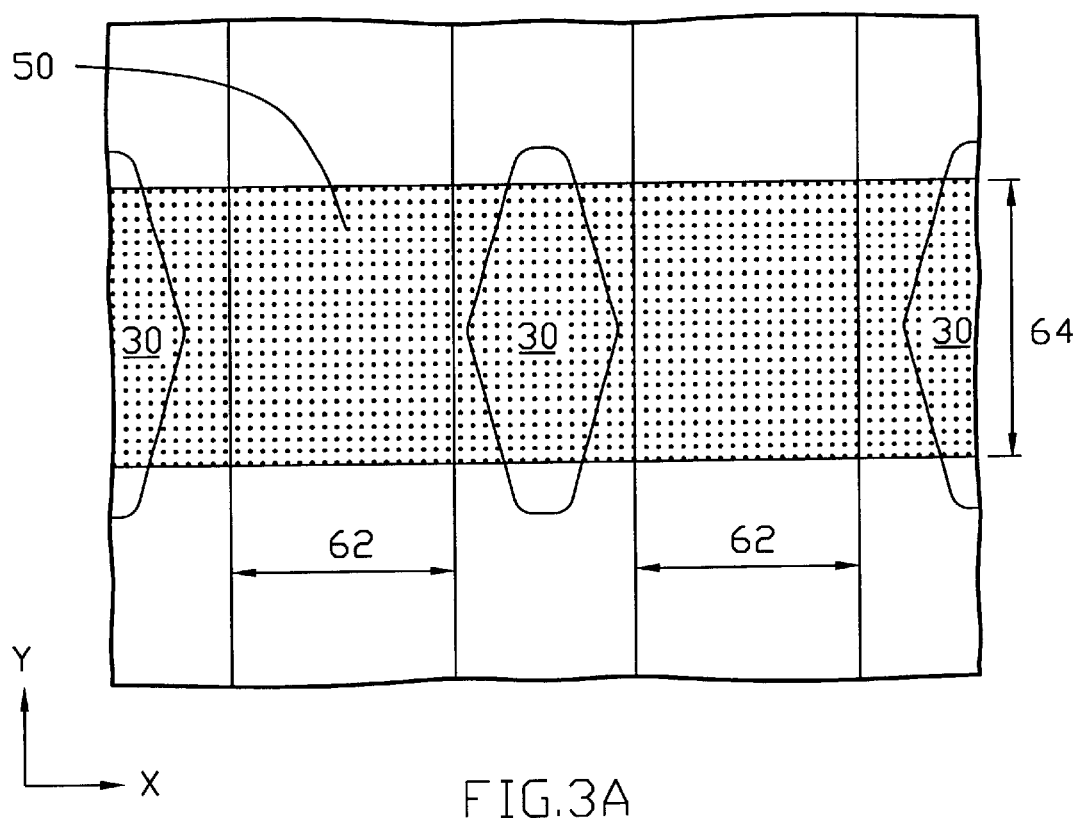
FIG. 3A to FIG. 3B are schematic representations of structures and the top views at various stages during the formulation of poly spacer ETOX flash memory device with electric field enhancing corners for poly to poly erase, in accordance with the present invention.
Figure 3B:
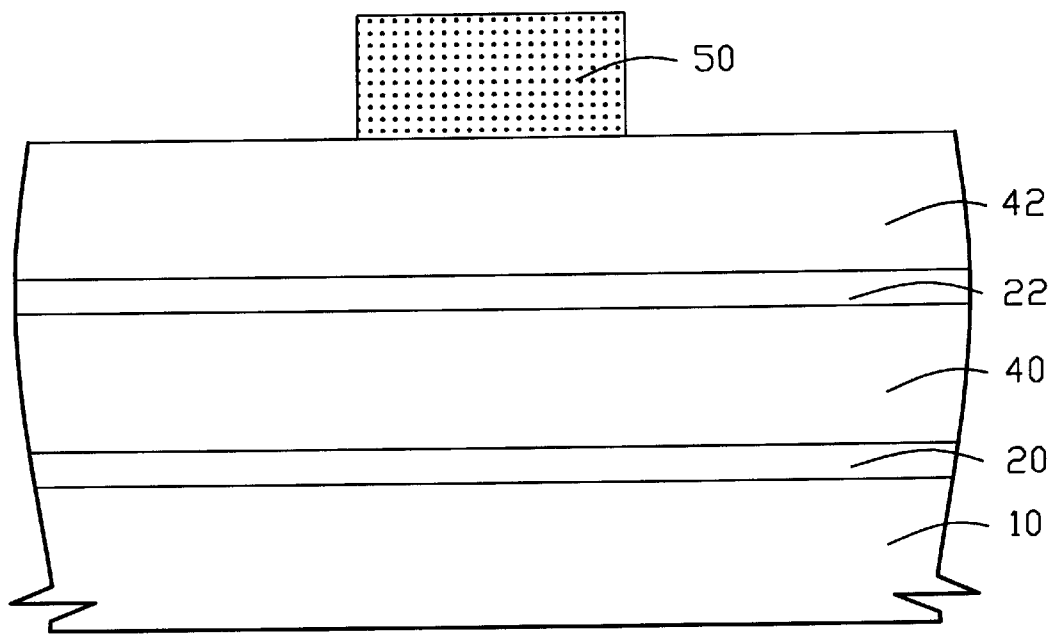

Referring to FIG. 3A to FIG. 3B, as shown in FIG. 3B, a first dielectric layer 22 that is an oxide-nitride-oxide composite film is formed by sequentially depositing a first silicon oxide layer, a silicon nitride layer, and a second silicon oxide layer on the first polysilicon 40. Then, a second polysilicon layer 42 used as a control gate is deposited on the first dielectric layer 22. Next, as shown in FIG. 3A, a photoresist mask 50 is formed to define the region of the control gate 42. The photoresist mask 50 is a belt form region 64 which is vertical to the active region 62 and cross through those polysilicon holes 30. The axle of the photoresist mask 50 is through the center of those polysilicon holes 30, and the width of the photoresist mask 50 is smaller than those polysilicon holes 30.

Figure 4A:
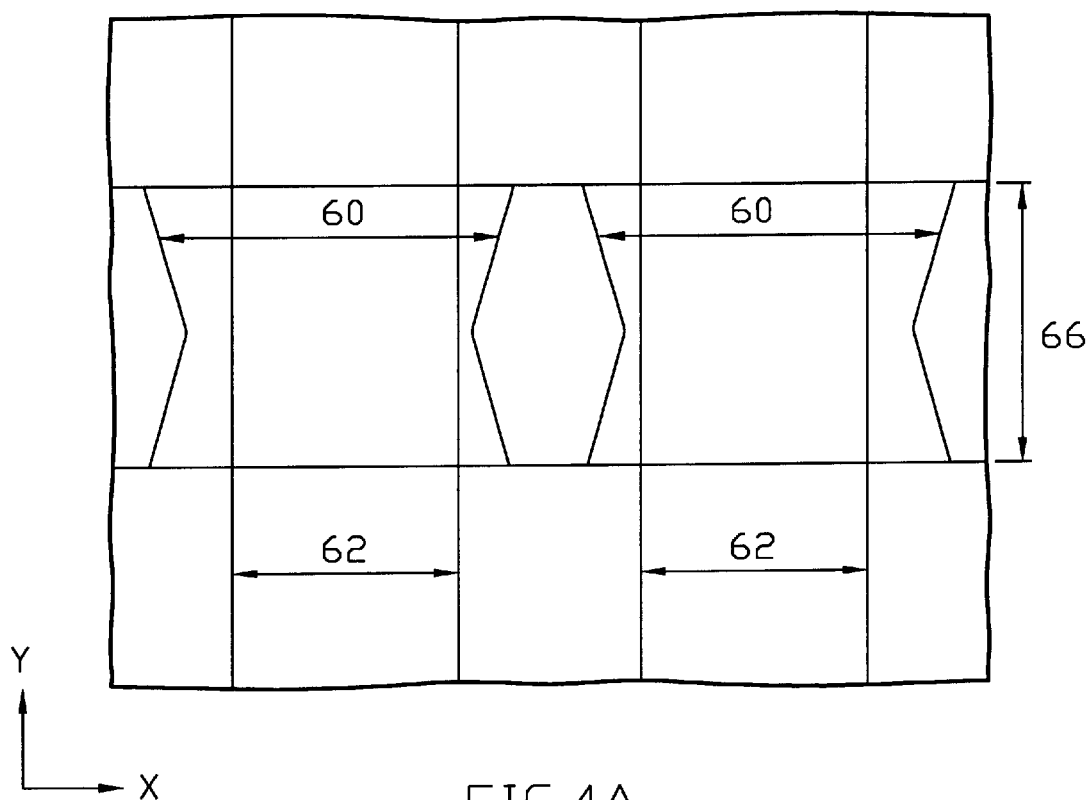
FIG. 4A to FIG. 4D are schematic representations of structures and the top views at various stages during the formulation of poly spacer ETOX flash memory device with electric field enhancing corners for poly to poly erase, in accordance with the present invention.
Figure 4B:
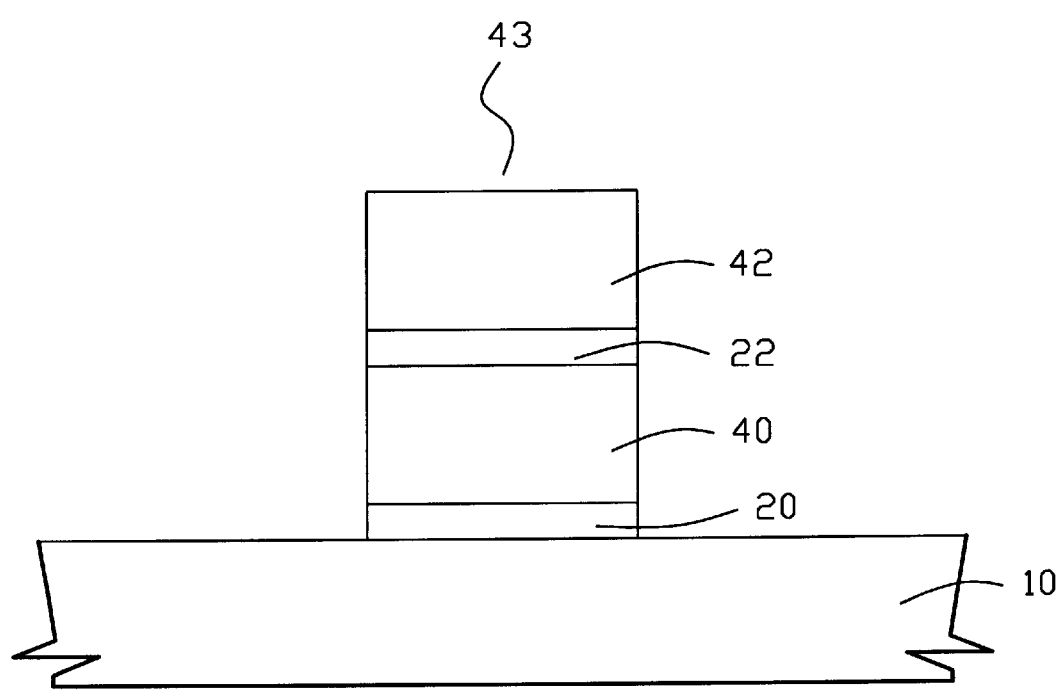

Referring to 4A and FIG. 4B, in FIG. 4B, a stacking gate electrode 43 is formed on the substrate 10 by etching process to remove a portion of the second polysilicon layer 42, the first dielectric layer 22, the first polysilicon layer 40, and the gate oxide layer 20. In FIG. 4A, the region 60 is the floating gate with its four acute angles and the border which is nonparallel and non-vertical to the active region 62 from top view. The region 66 is the control gate 42 which is taenioid above the floating gate 40 as shown in FIG. 4B.

Figure 4C:
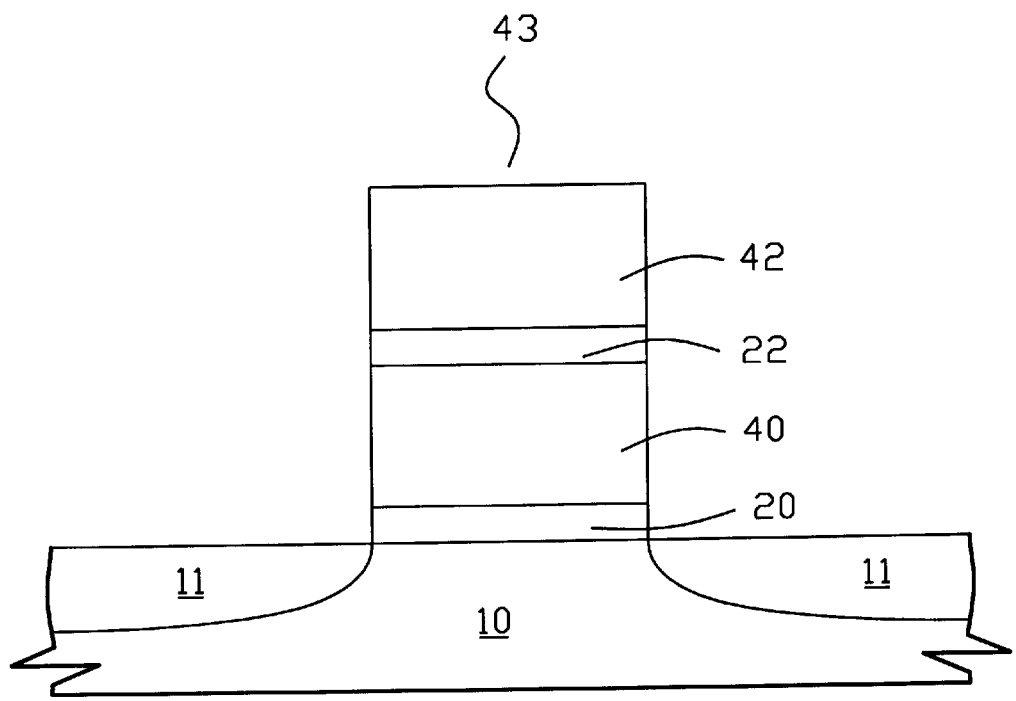

Then, an oxide layer is formed on the side wall of the stacking gate electrode 43 by thermal oxidation process, as not shown in Figures. Referring to FIG. 4C, after a self-aligned source process, a source/drain region 11 is formed in the substrate 10 around the stacking gate electrode 43 by ion implanting and annealing processes.

Figure 4D:
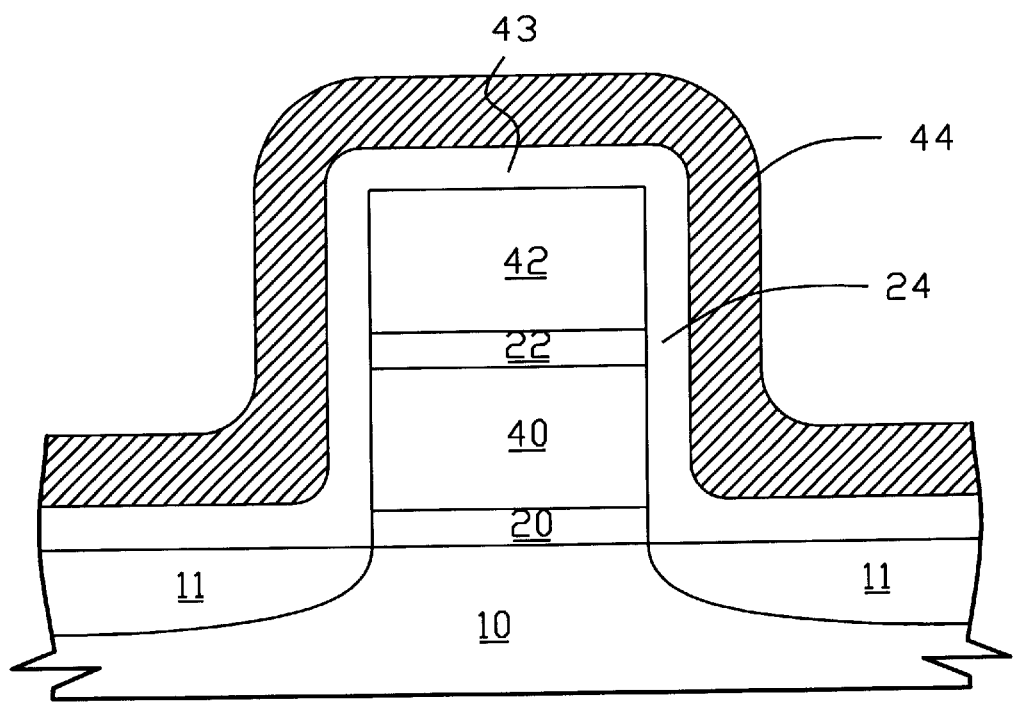

Referring to FIG. 4D, a second dielectric layer 24 is conformally deposited over the substrate 10 and a third polysilicon layer 44 is conformally deposited on the second dielectric layer 24.

Figure 5A:
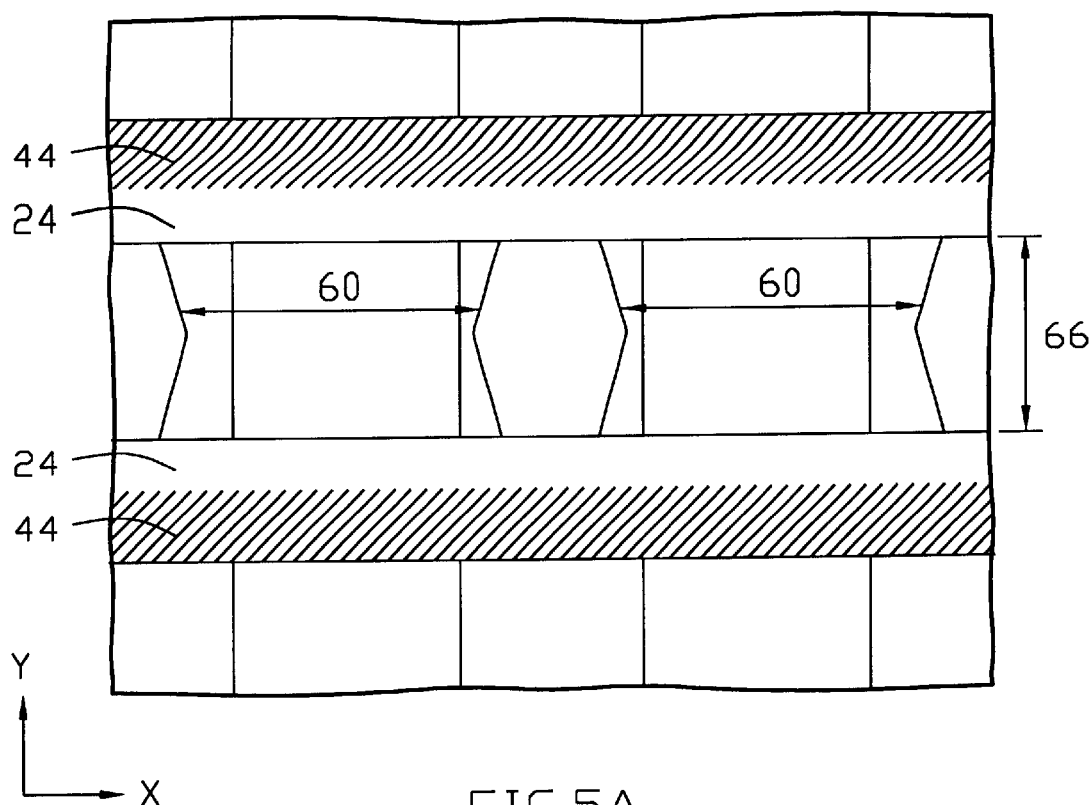
FIG. 5A to FIG. 5B are schematic representations of structures and the top views at various stages during the formulation of poly spacer ETOX flash memory device with electric field enhancing corners for poly to poly erase, in accordance with the present invention.
Figure 5B:
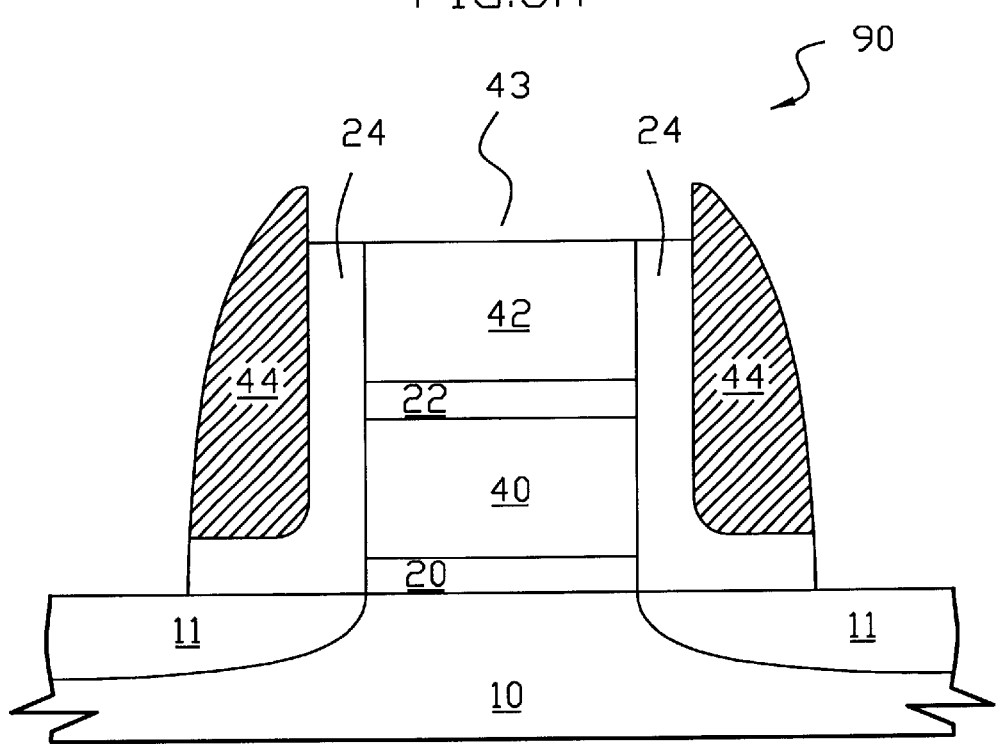

Referring to FIG. 5A and FIG. 5B, a polysilicon spacer 44, which is formed by photolithographic and etching processes, is using the second dielectric layer 24 as a stop layer. The polysilicon spacer 44 is used as an erase gate electrode 44. At the same time, a contact pad of the erase gate 44 is formed, as not shown in FIG. 5A and FIG. 5B, and will be detailed explained by following Figures. Then, the second dielectric layer 24 is blanket etched by using the polysilicon spacer 44 as a hard mask.

Following FIG. 4D, the formation of the contact pad 48 of the erase gate electrode 44 is detailed shown in FIG. 6A to FIG. 6D, FIG. 7A to FIG. 7D, and FIG. 8A to FIG. 8D.

Figure 6A:
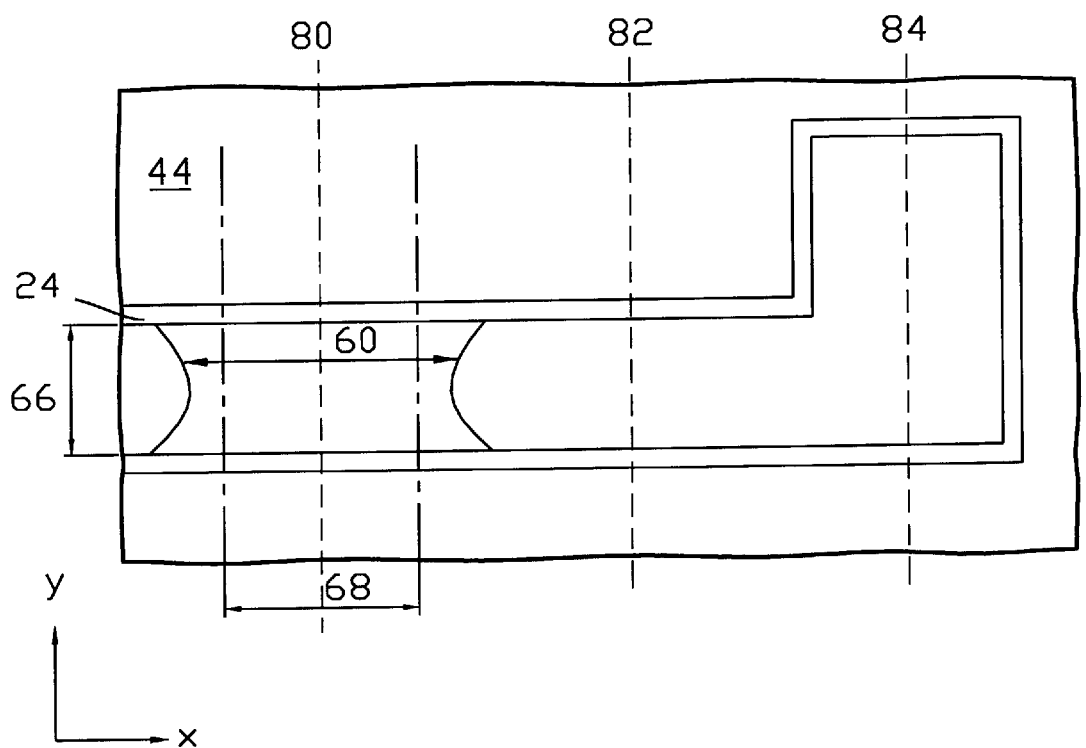
FIG. 6A to FIG. 6D, FIG. 7A to FIG. 7D, and FIG. 8A to FIG. 8D are schematic representations structures at various stages during the formulation of the contact pad of the erase gate electrode of poly spacer ETOX flash memory device with electric field enhancing corners for poly to poly erase, in accordance with the present invention.
Figure 6B:
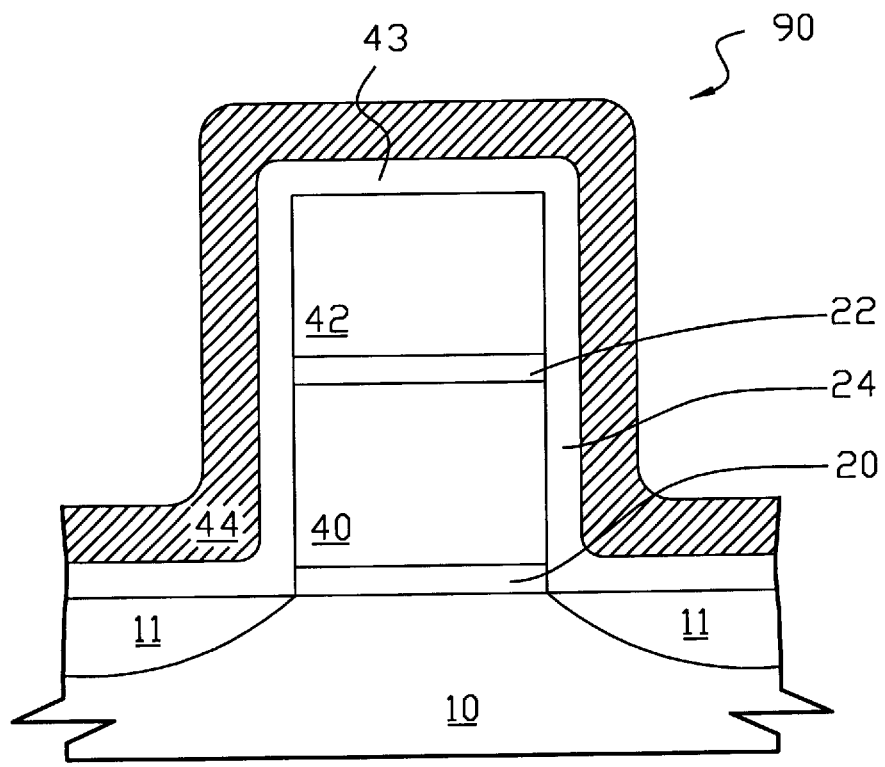
Figure 6C:
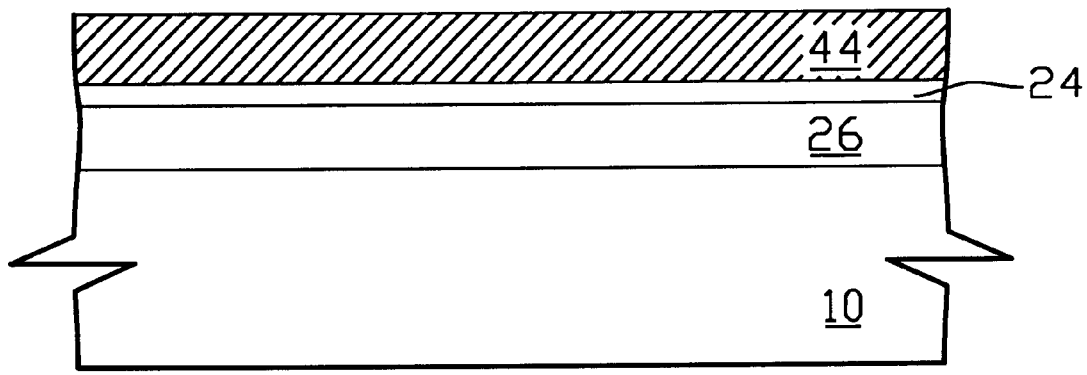
Figure 6D:
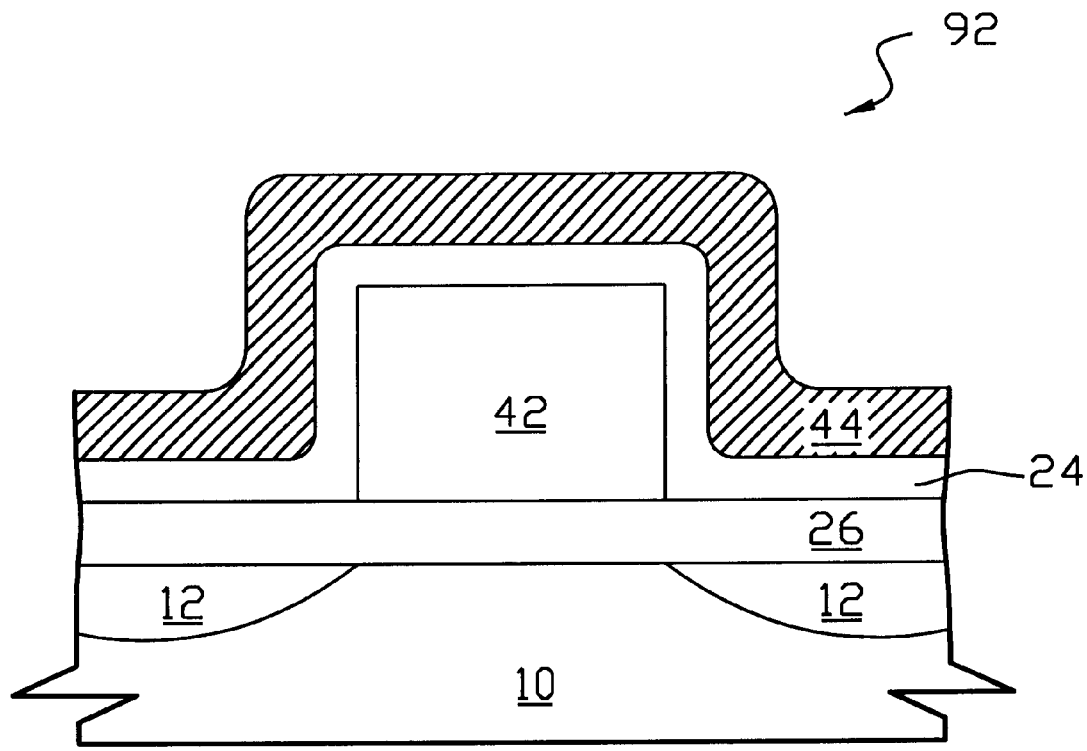

Referring to FIG. 6A, it is a partial top view of a memory product. The cross section of a dotted line 80 is the memory device 90, as shown in FIG. 6B. The cross section of a dotted line 82 is a region for forming a contact pad 48, as shown in FIG. 6C. The cross section of a dotted line 84 is a control gate contact pad 92, as shown in FIG. 6D.

Figure 7A:
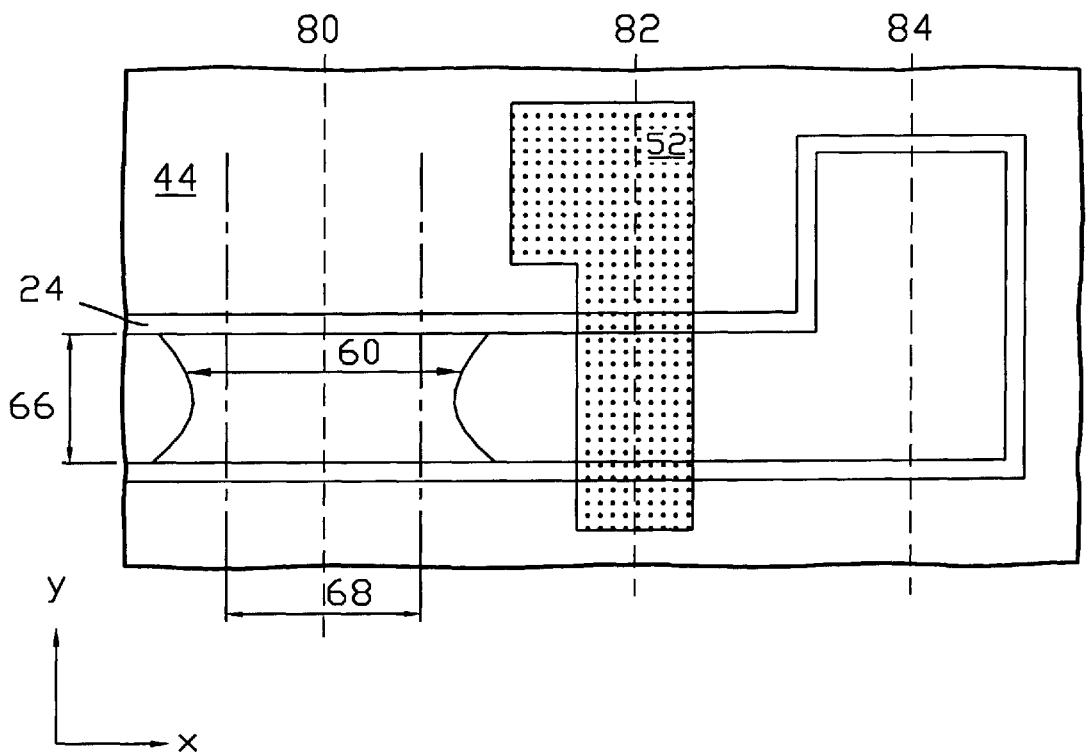
Figure 7B:
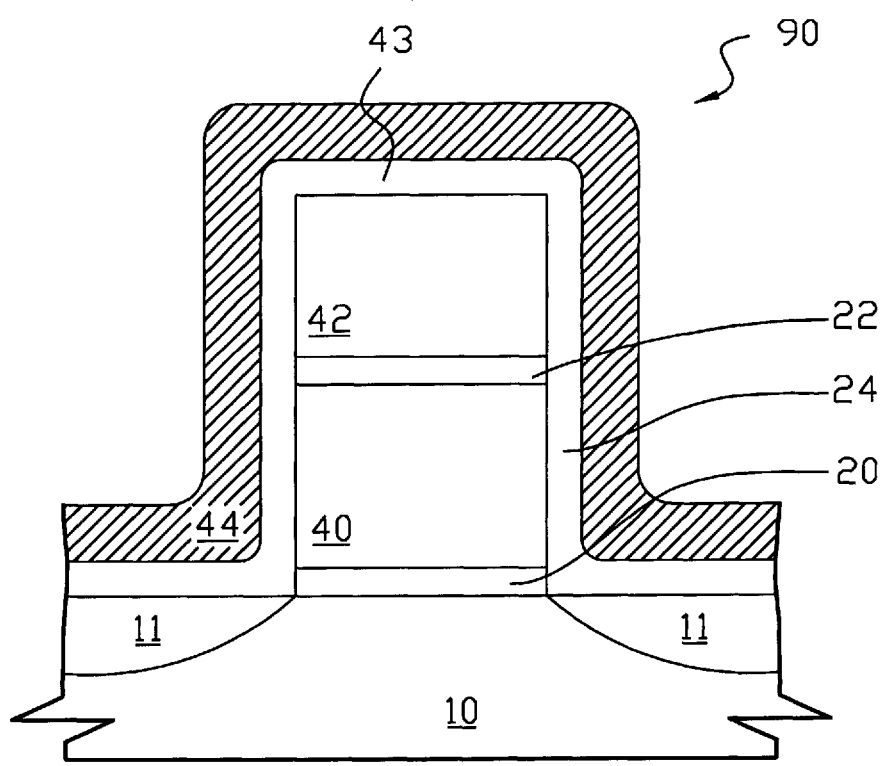
Figure 7C:
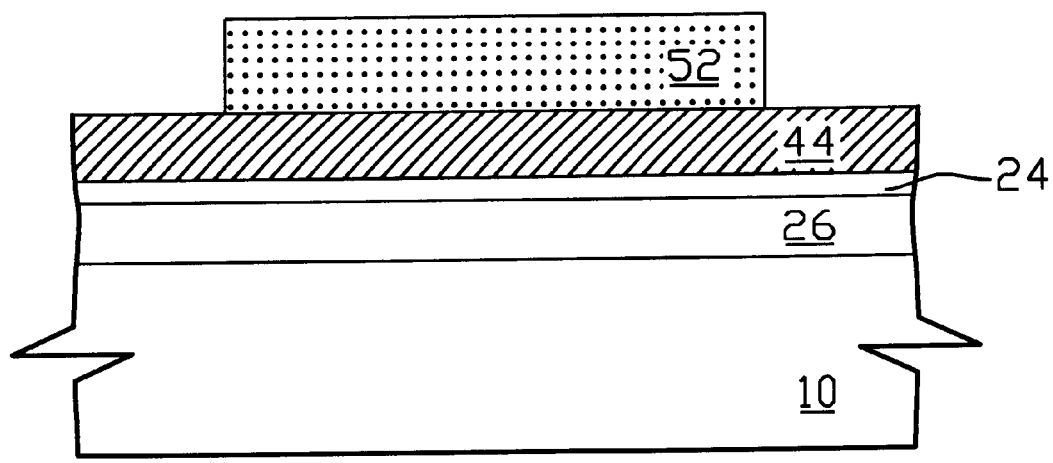
Figure 7D:
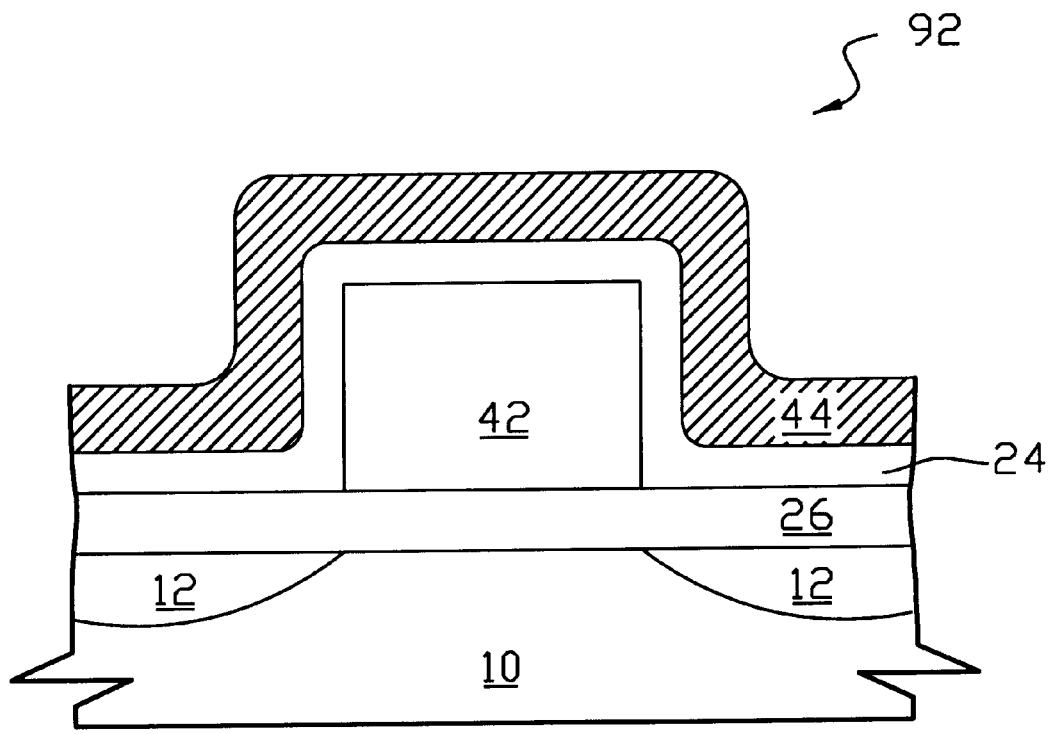
Figure 8A:
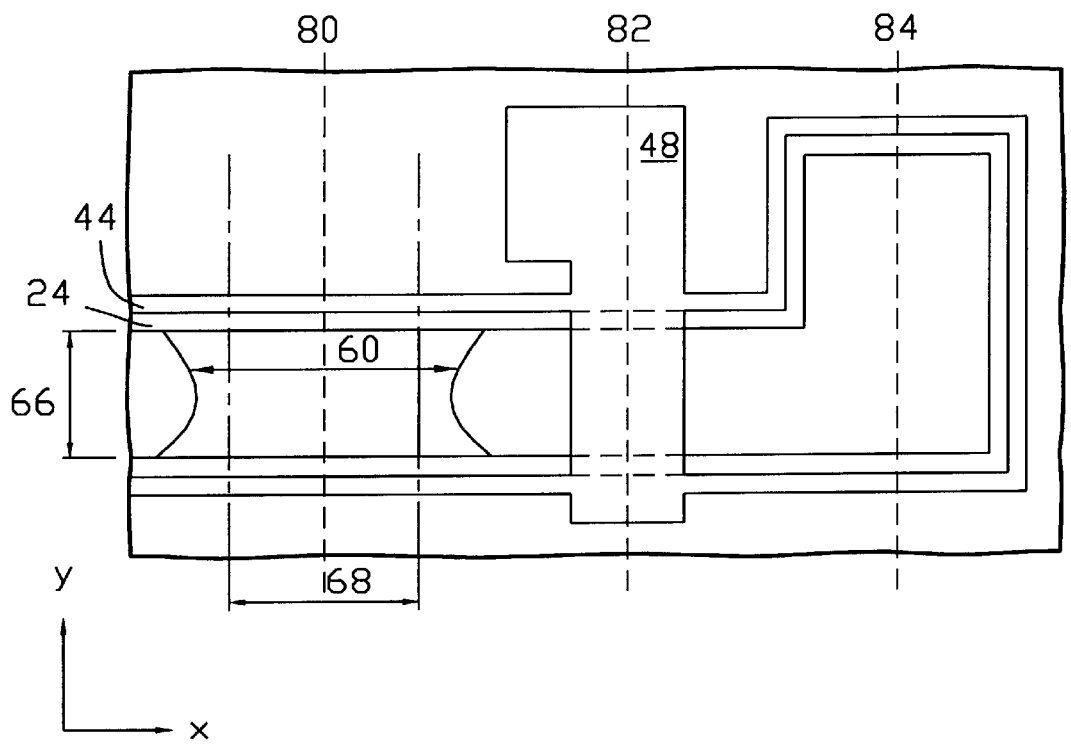
Figure 8B:
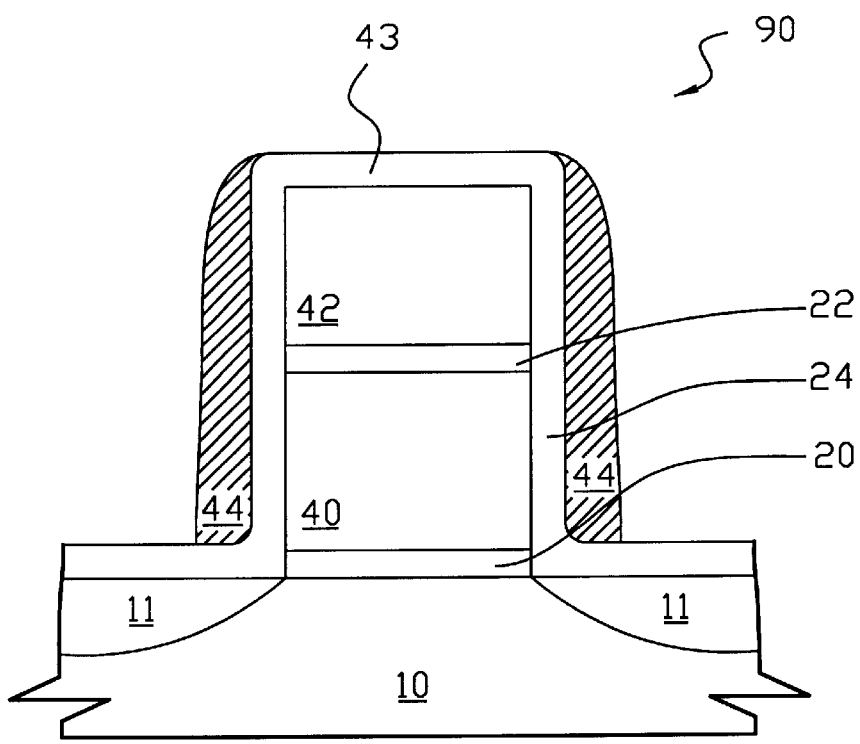
Figure 8C:
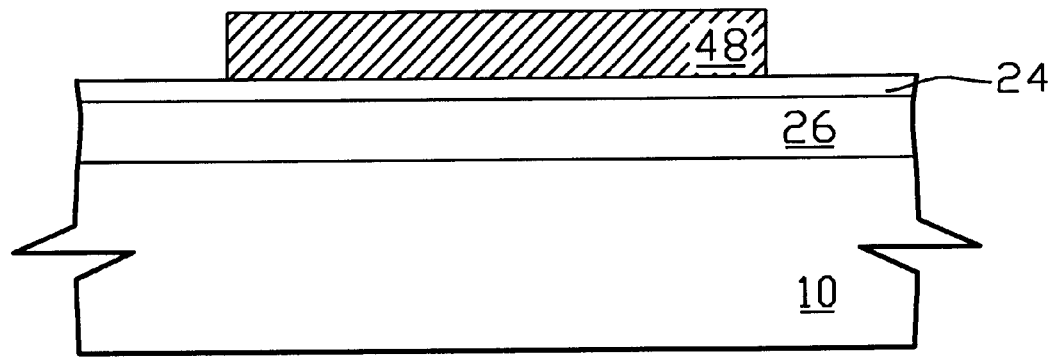
Figure 8D:
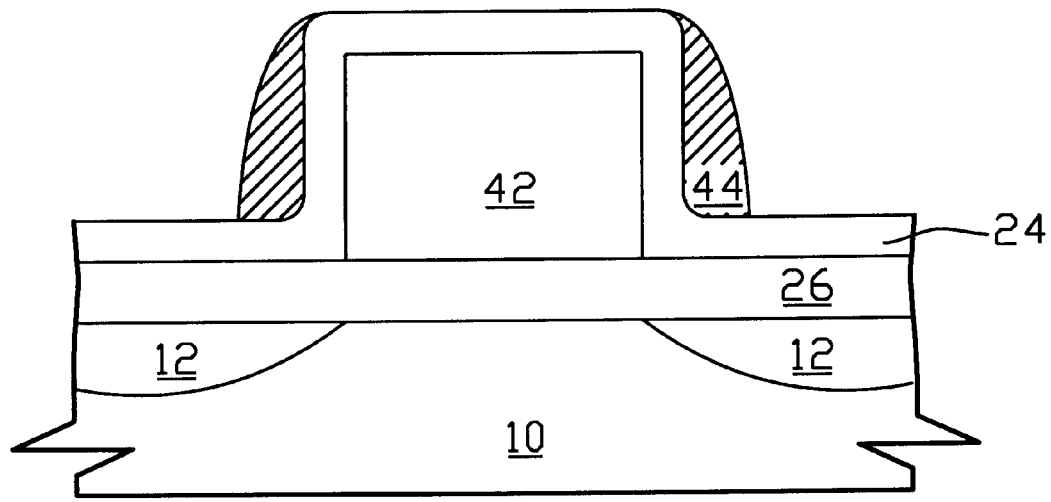

Referring to FIGS. 7A to 7D, that is shown the steps for forming a contact pad of the memory device erase gate electrode. Then, a photoresist mask 52 is formed to define the region of the contact pad 48. As shown in FIG. 7C, a field oxide layer 26 and a second dielectric layer 24 are sequentially formed on the substrate 10. Next, a polysilicon layer 44 is formed on the second dielectric layer 24. Referring to FIG. 7C The formation of the contact pad 48 needs only the photoresist mask 52 to define the region and can be integrated with the fabrication of conventional MOS devices. In FIG. 7D is shown another direction section views of formation of the contact of the memory device erase gate electrode. There is a source/drain region 12 formed in the substrate 10 by conventional ion implementation process.

Referring to FIG. 8A to 8D, the contact pad 48 is formed by etching process which the second dielectric layer 24 is used as a stop layer. At the same time, the polysilicon spacer 44 as the erase gate is formed around the stacking gate electrode 43.

To sum up, the present invention provides a method for forming an poly spacer ETOX flash memory device with a floating gate having electric-field enhancing corners for poly to poly erase. The present invention can provide not only to reduce the stress produced by transferred electrodes through the tunnel oxide layer in program/erase cycles and to lessen the cell size with poly to poly erase but also raise the efficiency of the erasing mechanism by electric field enhancing corners of the floating gate.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for forming a non-volatile memory, said method comprising:

providing a substrate;

forming a gate oxide layer on said substrate;

depositing a first polysilicon layer on said gate oxide layer;

removing a portion of said first polysilicon layer to form polysilicon holes, no border of said polysilicon holes being vertical and parallel to the border of an active region from top view;

depositing a first dielectric layer on said first polysilicon layer;

depositing a second polysilicon layer on said first dielectric layer;

performing photolithography and etching processes to form a stacking gate electrode which comprising a first gate electrode having corners and a second gate electrode, wherein a first gate electrode is formed by said first polysilicon layer, and a second gate electrode is formed by said second polysilicon layer;

forming a source/drain region in said substrate;

depositing conformally a second dielectric layer over said substrate;

depositing conformally a third polysilicon layer on said second dielectric layer;

blanket etching said third polysilicon layer to form a polysilicon spacer by using said second dielectric layer as a stop layer; and blanket etching said second dielectric layer by using said polysilicon spacer as a mask, whereby each said corner has an acute angle such that electrons stored in said first gate electrode can be emitted easily into said polysilicon spacer.

2. The method according to claim 1, wherein said gate oxide layer is formed by thermal oxidation process.

3. The method according to claim 1, wherein said first dielectric layer is formed by sequentially thermal growing a first silicon oxide layer, a silicon nitride layer, and a second silicon oxide layer.

4. The method according to claim 1, wherein said polysilicon holes comprise lozenged shape, round shape, and elliptically shape form top view.

5. The method according to claim 1, wherein said source/drain region is formed by ion implantation.

6. The method according to claim 5, further comprising a self aligned source process.

7. The method according to claim 1, further comprising a step of thermal growing a wall oxide on said stacking gate electrode.

8. A method for forming a flash memory device, said method comprising:

providing a substrate;

forming a gate oxide layer on said substrate;

depositing a first polysilicon layer on said gate oxide layer;

removing a portion of said first polysilicon layer to form polysilicon holes, no border of said polysilicon holes being vertical and parallel to the border of an active region from top view;

depositing a first dielectric layer on said first polysilicon layer;

depositing a second polysilicon layer on said first dielectric layer;

performing photolithography and etching processes to form a stacking gate electrode which comprising a floating gate having corners and a control gate, wherein said floating gate is formed by said first polysilicon layer, and said control gate is formed by said second polysilicon layer;

forming a source/drain region in said substrate;

depositing conformally a second dielectric layer over said substrate;

depositing conformally a third polysilicon layer on said second dielectric layer;

blanket etching said third polysilicon layer to form a polysilicon spacer by using said second dielectric layer as a stop layer; and blanket etching said second dielectric layer by using said polysilicon spacer as a mask, whereby each said corner has an acute angle such that electrons stored in said floating gate can be emitted easily into said polysilicon spacer.

9. The method according to claim 8, wherein said gate oxide layer is formed by thermal oxidation process.

10. The method according to claim 8, wherein said first dielectric layer is formed by sequentially thermal growing a first silicon oxide layer, a silicon nitride layer, and a second silicon oxide layer.

11. The method according to claim 8, wherein said polysilicon holes comprise lozenged shape, round shape, and elliptically shape form top view.

12. The method according to claim 8, wherein said source/drain region is formed by ion implantation.

13. The method according to claim 12, further comprising a self aligned source process.

14. The method according to claim 8, further comprising a step of thermal growing a wall oxide on said stacking gate electrode.

15. A method for forming an ETOX flash memory device, said method comprising:

providing a substrate;

thermally growing a gate oxide layer on said substrate;

depositing a first polysilicon layer on said gate oxide layer;

removing a portion of said first polysilicon layer to form polysilicon holes, no border of said polysilicon holes being vertical and parallel to the border of an active region from top view;

depositing a first dielectric layer on said first polysilicon layer;

depositing a second polysilicon layer on said first dielectric layer;

performing photolithography and etching processes to form a stacking gate electrode which comprising a floating gate having corners and a control gate, wherein said floating gate is formed by said first polysilicon layer, and said control gate is formed by said second polysilicon layer;

forming a source/drain region in said substrate by ion implantation;

depositing conformally a second dielectric layer over said substrate;

depositing conformally a third polysilicon layer on said second dielectric layer;

blanket etching said third polysilicon layer to form a polysilicon spacer by using said second dielectric layer as a stop layer, wherein said polysilicon spacer is used as an erase gate electrode; and blanket etching said second dielectric layer by using said polysilicon spacer as a mask, whereby each said corner has an acute angle such that electrons stored in said floating gate can be emitted easily into said polysilicon spacer.

16. The method according to claim 15, wherein said first dielectric layer is formed by sequentially thermal growing a first silicon oxide layer, a silicon nitride layer, and a second silicon oxide layer.

17. The method according to claim 15, wherein said polysilicon holes comprise lozenged shape, round shape, and elliptically shape form top view.

18. The method according to claim 15, further comprising a self aligned source process.

19. The method according to claim 15, further comprising a step of thermal growing a wall oxide on said stacking gate electrode.

* * * * *